United States Patent [19]
Brown

[11] Patent Number: 6,148,673
[45] Date of Patent: Nov. 21, 2000

[54] DIFFERENTIAL PRESSURE SENSOR AND METHOD THEREOF

[75] Inventor: Clem H. Brown, Scottsdale, Ariz.

[73] Assignee: Motorola, Inc., Schaumburg, Ill.

[21] Appl. No.: 08/319,913

[22] Filed: Oct. 7, 1994

[51] Int. Cl.[7] .............................. G01L 9/06; H01L 23/495
[52] U.S. Cl. .............................. 73/721; 73/726; 257/676; 257/677
[58] Field of Search .............................. 73/708, 721, 727, 73/726, 754, 720, 756; 257/669, 676, 677; 174/52.4

[56] References Cited

U.S. PATENT DOCUMENTS

| | | | |
|---|---|---|---|
| 3,629,668 | 12/1971 | Hingorany et al. | 257/677 |
| 4,023,562 | 5/1977 | Hynecek et al. | 128/2.05 E |
| 4,315,236 | 2/1982 | Tominaga et al. | 338/4 |
| 4,399,707 | 8/1983 | Wamstead | 73/727 |
| 4,658,651 | 4/1987 | Le | 73/708 |
| 4,716,492 | 12/1987 | Charboneau et al. | 361/283 |
| 4,823,605 | 4/1989 | Stein | 73/727 |
| 5,125,275 | 6/1992 | Wilda et al. | 73/756 |
| 5,207,102 | 5/1993 | Takahashi et al. | 73/727 |
| 5,289,033 | 2/1994 | Asami et al. | 257/676 |

*Primary Examiner*—Harshad Patel
*Attorney, Agent, or Firm*—A. Kate Huffman

[57] ABSTRACT

A differential pressure sensor (10) has a sensor die (30) eutectically attached to a mounting flag (14). The mounting flag has a similar coefficient of thermal expansion to the sensor die. The eutectic attachment provides a hermetic seal between the mounting flag and the sensor die. Pressure is applied to sensor die port (20). A molded housing (12) is molded around the sensor die-mounting flag assembly. Port (22) in the molded housing is filled with a silicone gel (52). A second pressure source is transferred by way of the silicone gel to the sensor die. Any media entering port (20) contacts the first surface of the sensor die to assert pressure against a piezoresistive transducer circuit (32) to generate the electrical signals representative of the applied pressure but are isolated from the sensitive interconnects by the hermetic seal.

19 Claims, 1 Drawing Sheet

DIFFERENTIAL PRESSURE SENSOR AND METHOD THEREOF

BACKGROUND OF THE INVENTION

The present invention relates in general to pressure sensors and, more particularly, to a differential pressure sensor suitable for use in high pressure sensing applications.

High pressure differential pressure sensors are commonly used to monitor fluid and gas pressures such as petroleum products, hydraulic braking, steam, radiator, air conditioning pump, and boiler pressures. In such applications the fluids or gases to be sensed on one side of the sensor are considered hostile. The fluids or gases typically include gasoline, ammonia based compounds, freons, brake fluid, and alcohols. The high pressure side of the sensor is typically exposed to pressures in the range from 20 psi to 1000 psi. The opposite side of the sensor is typically exposed to a less active medium such as air at atmospheric pressure.

A strain gauge piezoresistive type pressure sensor is often used in hostile environments. The strain gauge type pressure sensor converts a mechanically sensed differential pressure to an electrical signal representative of the differential pressure. To protect the circuitry from the adverse environment, the sensor may be mounted within a stainless steel body that is welded shut. While the strain gauge type sensor is media and pressure compatible, it is expensive to manufacture and does not lend itself to applications where space and weight considerations are important. Additionally, it is known that the strain gauge type pressure sensor is difficult to adjust for varying temperature conditions within the application. It is known in the art that strain gauge type sensors also lack the accuracy required to fully take advantage of microprocessor control technology available for use in pressure sensor applications. An automobile application of differential high pressure sensing, such as fuel pressure, is an example where the practice of using a strain gage type sensor is not optimal.

Another type of pressure sensor that is presently used is the ceramic capacitive pressure transducer. The ceramic capacitive pressure transducer is generally limited to low pressure applications and is less accurate than the strain gauge sensor. The ceramic capacitive sensor also requires an expensive, metal type welded housing structure.

Sensors that are designed to exhibit a high degree of accuracy often incorporate a silicon pressure sensor die. The silicon pressure sensor die resolves weight and size issues, but presents new challenges in relation to packaging for a hostile environment. Hermeticity of the package seal is one issue that must be addressed. Moreover, since the silicon die are inherently fragile, the packaging scheme must also include die stress relief. Attachment of the sensor die to their respective housings is accomplished by anodically bonding the sensor die to a borosilicate glass platform, or by using a flexible silicone adhesive to attach the sensor die to a package body.

In the case where borosilicate glass is used, the sensor lends itself to high pressure applications. Unfortunately, the cost of conforming the glass to a final package is often excessive. If the glass cannot be made to conform to the final package shape in a cost effective manner, and therefore cannot form a seal, the resulting device becomes media incompatible with hostile environments. The use of flexible silicone adhesives to attach pressure sensor die and provide conformal packaging is generally limited by the media compatibility of the adhesive.

Hence, a need exists for a precision differential high pressure sensor that is small in size, lightweight, low in cost, and suited for use in hostile environments.

DETAILED DESCRIPTION OF THE PREFERRED EMBODIMENT

Figure 1:
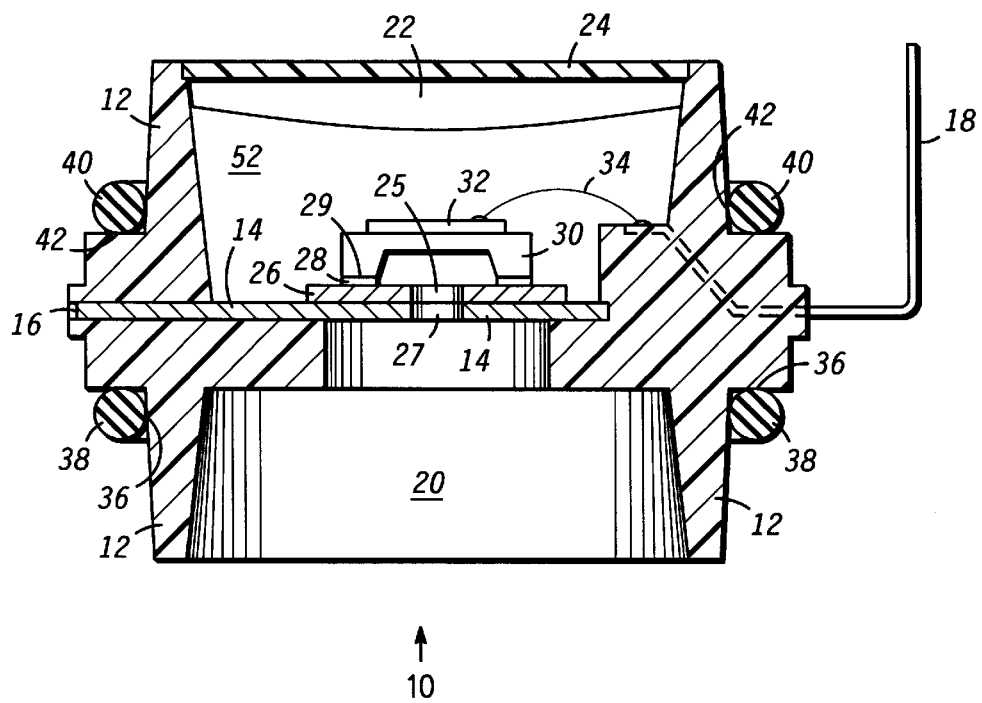
FIG. 1 illustrates a cross sectional view of a plastic molded differential electronic pressure sensor.

The present invention provides a hermetically sealed electronic differential pressure sensor device for detecting a wide range of fluid or gas pressures and for supplying an electrical signal representative of the differential pressures applied to the device. A plastic housing is molded around a leadframe assembly. The leadframe assembly contains a pressure sensitive semiconductor sensor die that is eutectically mounted on a mounting flag of a leadframe. The eutectic bond between the sensor die and the mounting flag provides a hermetic seal that isolates the sensor die associated circuitry and interconnects from hostile media from a first differential pressure applied to the first surface of the sensor die through a package port. A silicone gel isolates the sensor die associated circuitry and interconnects from media from a second differential pressure applied through a second package port. Additionally, the leadframe is selected of a material to have a similar coefficient of thermal expansion as the sensor die so that effects of packaging stresses are negated.

The differential pressure sensor includes a plastic housing with two ports that is molded around a leadframe assembly. The leadframe assembly includes a pressure sensitive semiconductor sensor die attached to a leadframe mounting flag, with a portion of the mounting flag embedded in the molded housing. The first port of the molded housing provides a pathway to expose a surface of the sensor die to a first of differential pressures. The second port of the molded housing provides a pathway to expose the opposite surface of the sensor die to a second of differential pressures. The sensor die is eutectically bonded to the mounting flag to form a hermetic seal between the package and the sensor die. The second port is partially filed with a silicon gel to protect the sensor die and its related interconnects from direct exposure to external media. When it is desired to use atmospheric air as the second differential pressure media, a cap is provided to seal the second port. The atmospheric air is thus captured between the cap and the silicone gel. The plastic molded housing of the pressure sensor also surrounds the peripheral area external to the sensor die. Package leads are also constrained by the molded housing. Electrical connections via wirebonds are made between the sensor die and the package leads to carry electrical signals to external connections on the package body. A first differential pressure is applied to the first port and a second differential pressure is applied to the second port. The sensor die flexes in response to the differential pressure and converts the mechanically sensed differential pressures to an electrical signal connected to the exterior of the sensor package via bond wires and a package leadframe.

The pressure sensor device provides an electronic silicon pressure sensing die in a package that can operate in many environments. The pressure sensor is designed to be media compatible and operate in environments such as fuel systems, hydraulic systems, aggressive vapor and liquid chemical environments such as cooling/heating systems and chemicals that may be either polar, non-polar, low or high acidity, or combinations thereof. In addition, the pressure media may be in liquid or gaseous form and be of temperatures in the ranges of −40° C. to +125° C. The device must maintain accuracy of pressure over the range of temperature and not allow the package to cause the silicon die to interpret package related stress as a false pressure.

Figure 2:
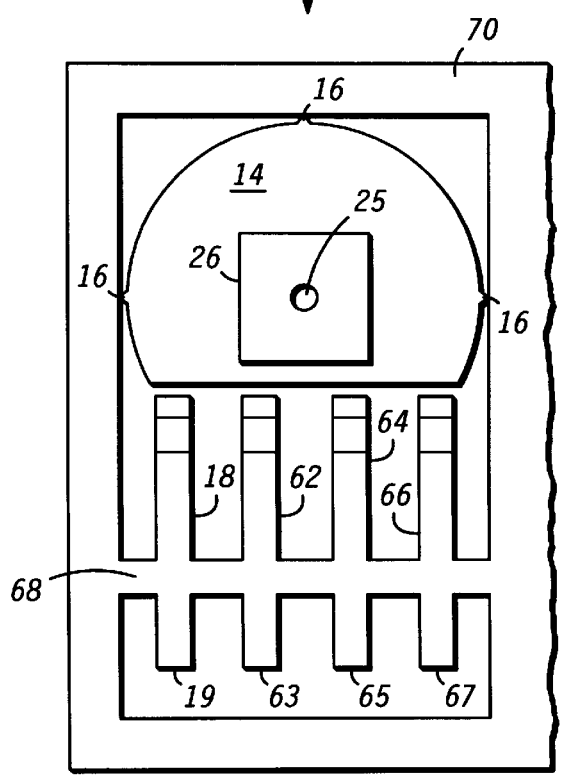
FIG. 2 illustrates a top view of a lead frame that is incorporated in the construction of the plastic molded differential electronic pressure sensor.

Referring to FIG. 1, a cross section of differential pressure sensor 10 is shown. A portion of leadframe 60 of FIG. 2 is shown in FIG. 1. Leadframe 60 portions include mounting flag 14, lead 18, and breaktab 16. Referring again to FIG. 1, sensor die surface 29 of sensor die 30 is coated with eutectic layer 28. Eutectic layer 28 is gold-germanium and has a minimum thickness of 12,000 angstroms. Eutectic layer 28 can also be a maximum of 20,000 angstroms thick. Bond surface 26 is disposed atop a portion of mounting flag 14 using a plating process. Bond surface 26 is a 150.0 microinch layer of gold, although a silver layer of the same thickness could be used as well. The range of thicknesses for bond surface 26 range from 100.0 to 150.0 microinches. Bond surface 26 contains a surface opening 25 that provides a passageway for a first differential pressure to be applied to sensor die 30. Mounting flag 14 contains flag opening 27 that is concurrent with surface opening 25, likewise to provide a passageway for a first differential pressure to be applied to sensor die 30. Sensor die 30 is attached to mounting flag 14, using eutectic layer 28 and bond surface 26 as an attaching interface media. Sensor die 30 and mounting flag 14 are heated to 430.0° C. in the vicinity of sensor die 30 and bond surface 26 interface to produce a eutectically bonded joint. Piezoresistive transducer circuit 32 is disposed on and is an integral part of a second surface of sensor die 30. Piezoresistive transducer circuit 32 converts the flexing of sensor die 30 into an electrical signal. Bondwire 34 is used to interconnect a tap point of piezoresistive transducer circuit 32 to lead 18 thus channeling the electrical signal from piezoresistive transducer circuit 32 to lead 18. Note that although only one bondwire 34, one lead 18, and only one breaktab 16 of leadframe 60 is shown in FIG. 1, multiple bondwires, multiple leads and multiple breaktabs are used to perform the task.

The completed sensor die 30 leadframe 60 assembly is placed in a molding apparatus and is subjected to a transfer mold process in which molded housing 12 is formed around leadframe 60 assembly. Alternatively, an injection mold process may be used to form molded housing 12 around leadframe 60 assembly.

Molded housing 12 serves to hold leadframe 60 components mounting flag 14, lead 18, and breaktab 16 in place and provides a housing and interconnect for sensor die 10. Molded housing 12 also provides an interconnect housing and forms a part of the protective environment for sensor die 30. Molded housing 12 material is an organic epoxy. Thermoplastics filled with inorganic matter may also be used for molded housing 12. Molded housing 12 includes a first port 20 coupled to flag opening 27 and surface opening 25 to supply a path for a first differential pressure to be applied to a first surface of sensor die 30. Port 20 is located near the center of molded housing 12 and positioned below sensor die 30. Molded housing 12 includes a second port 22 to provide a path for a second differential pressure to be applied to a second surface of sensor die 30. Port 22 is located near the center of molded housing 12 and positioned above sensor die 30. Port 22 is partially filled with silicone gel 52. Silicone gel 52 seals the second surface of sensor die 30, and its associated circuitry and interconnects, from external media. Silicone gel 52 also serves as a transfer medium for the second differential pressure to be applied to sensor die 30. A cap 24 is attached to second port 22 of pressure sensor 10. Cap 24 is attached with epoxy adhesive. Cap 24 may also be attached with a silicone adhesive or thermosonically welded in place. The space between cap 24 and silicone gel 52 is filled with atmospheric air. The atmospheric air is the second differential pressure to be applied to pressure sensor 10. Alternatively, the space between cap 24 and silicone gel 52 may be filled with other gases or liquids. In the case where other gases or liquids fill the space between cap 24 and silicone gel 52, installation of cap 24 would be performed in the gas or liquid environment.

A first retainer detent 42 is annularly disposed around the circumference of molded housing 12. Retainer detent 42 serves as a seat for seal 40 which provides isolation to channel the second external differential pressure into port 22. Retainer detent 36 is annularly disposed around the circumference of molded housing 12 and serves as a seat for seal 38 which provides isolation to channel the first external differential pressure into port 20. Seals 40 and 38 are elastomeric and are media compatible, i.e., made to function in the external environment, being made of nitrile rubber or like materials and are held in place by tension. Seals 40 and 38 further reduce vibration and mounting stresses in pressure sensor 10.

Referring further to FIG. 1, mounting flag 14, lead 18, and breaktab 16 comprise a portion of the leadframe 60 of FIG. 2. The relationship of lead 18 to mounting flag 14 as shown is referred to as a non-plannar relationship. Non-plannar terminology is known in the art. A non-plannar leadframe 60 has the advantage of providing single level bonding from piezoresistive transducer circuit 32 to lead 18. Although a non-plannar structure is shown in FIG. 1, the principles of the invention can be equally applied to a plannar leadframe structure. Materials selected for leadframe 60 are those that exhibit characteristics of thermal expansion that similar to that of sensor die 30. Leadframe 60 is stamped from alloy 42 material. Alloy 42 is selected because its thermal expansion characteristics closely match those of sensor die 30. Sensor die 30 is silicon. The matching of the material for leadframe 60, i.e., mounting flag 14, to sensor die 30 eliminates the need for a temperature buffering interface between molded housing 12 and sensor die 30. Other compositions of steel alloys containing nickel may also be used for leadframe 60. The selection of the material for leadframe 60 and the mounting of mounting flag 14 in a floating manner within molded housing 12, provides stress relief for sensor die 30, which is an feature of the present invention, and provides for ruggedization of the sensor package.

Bond surface 26 is plated on mounting flag 14 portion of leadframe 60. Bond surface 26 provides a eutectic medium for sensor die 30 attach process. Bond surface 26 is gold and is 150.0 microinches thick. The range of thickness for bond surface 26 is 100.0 to 150.0 microinches. A similar thickness of silver may be used in place of the gold layer for bond surface 26. Alternatively, plated bond surface 26 could be replaced with a preform. The preform would be comprised of a eutectic mix of metals and would perform a similar function to that of bond surface 26. Eutectic layer 28 is deposited on sensor die surface 29 using evaporation techniques. Sensor layer 28 is gold-germanium and has an acceptable thickness range of 12,000 to 20,000 angstroms. Sensor die 30 is bonded to mounting flag 14 through the application of localized heating of 430.0° C. During the heating process, the eutectic temperature of sensor layer 28 and bond surface 26 is reached and sensor layer 28 and bond surface 26 are eutectically joined. The resulting eutectic bonding provides a hermetic seal to all hostile media that may be applied through port 20 of pressure sensor 10, another desired feature of the present invention.

Breaktabs 16 are designed such that, after the molding process, the point of the breaktab 16 will be recessed within molded housing 12 by a space of 5.0 mils. When leadframe 60 is singulated, the tip of breaktab 16 maintains its recessed position. Break tabs 16 are 0.015 inch, which is typically one thickness of the leadframe, in terms of width at their narrowest point. One leadframe thickness translates to 0.015 inch. The force required to detach breaktabs 16 is less than 3.0 psi.

Sensor die 30 has eutectic layer 28 either evaporated or deposited on sensor die surface 29. Eutectic layer 28 is used to bond sensor die 30 to bond surface 26. The first surface of sensor die 30 may be exposed to a hostile environment.

Sensor die 30 is silicon with a transducer diaphragm formed by a micro-machining or silicon etching process into a square pattern approximately 0.001 inches thick. Disposed atop the second surface of sensor die 30 is piezoresistive transducer circuit 32. Eutectic layer 28 is gold and is evaporated onto sensor die surface 29 of sensor die 30 to provide a eutectic means by which to attach sensor die 30 to bond surface 26. The attachment process includes localized heating of sensor die 30 to 440° C. to melt eutectic layer 28. Bond surface 26 is also locally heated to 440° C. to melt its gold layer in the same vicinity as sensor die 30 interface. Sensor die 30 is placed in contact with bond surface 26 and resultingly bonded to mounting flag 14 via bond surface 26. Accordingly, it can be seen as another feature of the present invention, that a hermetic seal is developed between sensor die 30 and mounting flag 14. The hermetic seal prevents hostile media that enters port 20 from spreading into the region within port 22 and prevents deterioration and damage to the circuitry and interconnect housed within port 22.

Piezoresistive transducer circuit 32 is disposed on the sensor die 30 transducer diaphragm to provide a resistance in the path of externally applied direct current. Two current taps or electrical connections are made along the length of the primary resistor. Any change in the resistance film caused by pressure results in a change in the current flow in that respective resistor and appears as a voltage potential change on the taps. The diaphragm and the sensor silicon die are one integral device. The sensor die is electrically connected to the exterior of molded housing 12 through lead 18 with bondwire 34. Bondwires 34 are preferably gold and applied via thermosonic bonding. Aluminum could also be used in place of gold for bondwires 34 using ultrasonic bonding methods known in the art.

Cap 24 is attached to port 22 using an epoxy glue. Alternatively, cap 24 may be attached by a silicon glue or As an alternate embodiment of the present invention, if it is desired that a media, other than atmospheric air, be applied as the second differential pressure to pressure sensor 10, cap 24 need not be affixed to enclose port 22. Instead, a second differential pressure may be applied directly to silicone gel 52.

Turning now to FIG. 2, a top view of leadframe 60 is shown. Mounting flag 14 is joined to dambar 70 with breaktabs 16. Dambar 70 also serves to impede the flow of plastic in the dambar 70 area during the molding process. The use of dambars to impede plastic flow during molding processes is known in the art. Leads 18, 62, 64, 66 and lead extensions 19, 63, 65, 67 are joined to dam bar 70 using tie bar 68. Lead extensions 19, 63, 65, and 67 serve to elongate final package leads 18, 62, 64, and 66 when leadframe 60 is singulated. Portions of tiebar 68 that reside between 18, 62, 64, and 66 also are removed during the singulation process. The function of a tiebar such as tiebar 68 is known generally in the art. Bond surface 26 is disposed atop a portion of mounting flag 14 using a plating process. Bond surface 26 is a 150.0 microinch layer of gold, although a silver layer of the same thickness could be used as well. The range of thicknesses for bond surface 26 range from 100.0 to 150.0 microinches. Bond surface 26 contains a surface opening 25 that provides a passageway for a first differential pressure to be applied to sensor die 30 of FIG. 1.

Leadframe 60 is stamped from alloy 42 material. Alloy 42 is selected because its thermal expansion characteristics closely match those of sensor die 30 of FIG. 1. Sensor die 30 is silicon. The matching of the material for leadframe 60 of FIG. 2, i.e., mounting flag 14, to sensor die 30 eliminates the need for a temperature buffering interface between molded housing 12 and sensor die 30. Other compositions of steel alloys containing nickel may also be used for leadframe 60.

Breaktabs 16 are designed such that, after the molding process, mounting flag 14 may be easily separated from dambar 70 with a minimum applied pressure. Breaktabs 16 are 0.015 inch wide at their narrowest point, which is typically one thickness of leadframe 60. The force required to detach breaktabs 16 from dambar 70 is less than 3.0 psi and is applied to breaktabs 16 during pressure sensor 10 package singulation process. Breaktabs 16 provide an isolating mechanism for mounting flag 14 and allow mounting flag 14 to float after singulation of pressure sensor 30 from dambar 70.

The selection of material for leadframe 60 and the mounting of mounting flag 14 in a floating manner within molded housing 12 supply a stress relief mechanism for sensor die 30, an feature of the present invention.

By now it should be appreciated that a differential sensor packaging scheme has been presented that incorporates a silicon bulk micro-machined differential pressure sensor and transducer circuit that is hermetically sealed to a stress isolation mounting flag that is housed within a molded plastic package. The low cost package is capable of providing sensing in extreme environments and at elevated pressures while maintaining a hermetic seal.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A differential pressure sensor, comprising:
    a mounting flag detachable from a leadframe and having a flag opening for receiving a first pressure;
    a sensor die having a eutectic surface mounted to a bonding surface of said mounting flag for providing a hermetic seal between said sensor die and said mounting surface and coupled for receiving said first pressure; and
    a molded housing having a first port positioned over said flag opening and said sensor die for receiving said first pressure, said molded housing having a second port positioned over said sensor die for receiving a second pressure, and said molded housing surrounding a portion of said mounting flag to secure said mounting flag in a floating manner following detachment from said leadframe to provide stress relief for said sensor die.

2. The differential pressure sensor of claim 1 wherein said mounting flag comprises a composition of steel alloy including nickel having a coefficient of expansion similar to said sensor die.

3. The differential pressure sensor of claim 2 wherein said bonding surface is made of gold.

4. The differential pressure sensor of claim 3 further including a silicone gel disposed in the second port of said molded housing.

5. The differential pressure sensor of claim 4 wherein said sensor die includes:
- a transducer diaphragm that flexes in response to a difference of said first and second pressures;
- a piezoresistive transducer circuit mounted to said transducer diaphragm that changes resistance in response to said flexing of said transducer diaphragm; and
- a bonding wire coupled between a tap point of said piezoresistive transducer circuit and a lead of said molded housing.

6. The differential pressure sensor of claim 5 wherein said molded housing is organic epoxy.

7. A method of sealing a differential pressure sensor, comprising the steps of:
- providing a mounting flag detachable from a leadframe and having a flag opening for receiving a first pressure;
- providing a sensor die with a eutectic surface for mounting said sensor die to a bonding surface of said mounting flag to provide a hermetic seal between said sensor die and said mounting surface while said sensor die receives said first pressure;
- providing a molded housing with a first port positioned over said flag opening to receive said first pressure;
- providing a second port in said molded housing positioned over said sensor die to receive a second pressure;
- surrounding a portion of said mounting flag with said molded housing to secure said mounting flag; and
- separating said mounting flag from said leadframe so that said mounting flag floats with respect to said molded housing to provide stress relief for said sensor die.

8. The method of claim 7 wherein said mounting flag comprises a composition of steel alloy including nickel having a coefficient of expansion similar to said sensor die.

9. The method of claim 8 wherein said bonding surface is made of gold.

10. The method of claim 9 further including the step of disposing a silicone gel in said second port of said molded housing.

11. The method of claim 10 further including the steps of:
- providing a transducer diaphragm that flexes in response to a difference of said first and second pressures;
- providing a piezoresistive transducer circuit mounted to said transducer diaphragm that changes resistance in response to said flexing of said transducer diaphragm; and
- providing a bonding wire coupled between a tap point of said piezoresistive transducer circuit and a lead of said molded housing.

12. The method of claim 11 wherein said molded housing is organic epoxy.

13. A differential pressure sensor, comprising:
- a mounting flag detachable from a leadframe and having a flag opening for receiving a first pressure;
- a sensor die with a eutectic surface mounted to said mounting flag and coupled for receiving said first pressure;
- a gold layer disposed between said eutectic surface and said mounting flag for providing a hermetic seal between said sensor die and said mounting flag;
- a molded housing having a first port positioned over said flag opening and said sensor die for receiving said first pressure, said molded housing having a second port positioned over said sensor die for receiving a second pressure, and said molded housing surrounding a portion of said mounting flag to secure said mounting flag in a floating manner following detachment from said leadframe to provide stress relief for said sensor die; and
- a silicone gel disposed in said second port of said molded housing.

14. The differential pressure sensor of claim 13 wherein said mounting flag includes a composition of steel alloy with nickel having a coefficient of expansion similar to said sensor die.

15. The differential pressure sensor of claim 14 wherein said eutectic surface is made of gold.

16. The differential pressure sensor of claim 15 wherein said sensor die includes a transducer diaphragm that flexes in response to a difference of said first and second pressures.

17. The differential pressure sensor of claim 16 wherein said sensor die includes a piezoresistive transducer circuit mounted to said transducer diaphragm that changes resistance in response to said flexing of said transducer diaphragm.

18. The differential pressure sensor of claim 17 wherein said sensor die includes a bonding wire coupled between a tap point of said piezoresistive transducer circuit and a lead of said molded housing.

19. The differential pressure sensor of claim 18 wherein said molded housing is organic epoxy.

* * * * *